United States Patent
Yoo et al.

(10) Patent No.: US 9,209,114 B2
(45) Date of Patent: *Dec. 8, 2015

(54) POWER MODULE PACKAGE WITH A FASTENING UNIT INCLUDING A NON-CONDUCTIVE PORTION

(71) Applicant: SAMSUNG ELECTRO-MECHANICS CO., LTD., Suwon (KR)

(72) Inventors: Do Jae Yoo, Suwon (KR); Young Ki Lee, Suwon (KR); Bum Seok Suh, Suwon (KR); Joon Seok Chae, Suwon (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/846,591

(22) Filed: Mar. 18, 2013

(65) Prior Publication Data

US 2014/0001619 A1 Jan. 2, 2014

(30) Foreign Application Priority Data

Jun. 29, 2012 (KR) .................. 10-2012-0070666

(51) Int. Cl.
*H01L 23/34* (2006.01)
*H01L 23/495* (2006.01)
(Continued)

(52) U.S. Cl.
CPC ............. *H01L 23/495* (2013.01); *H01L 21/50* (2013.01); *H01L 23/055* (2013.01); *H01L 23/142* (2013.01); *H01L 23/3735* (2013.01); *H01L 23/492* (2013.01); *H01L 23/49811* (2013.01); *H01L 24/96* (2013.01); *H01L 25/072* (2013.01); *H01L 23/13* (2013.01); *H01L 24/29* (2013.01); *H01L 24/32* (2013.01); *H01L 24/45* (2013.01); *H01L 24/48* (2013.01); *H01L 24/73* (2013.01); *H01L 24/92* (2013.01);
(Continued)

(58) Field of Classification Search
CPC ........... H01L 2224/48091; H01L 2224/48227; H01L 25/072
USPC ........................................ 257/708, 726, 727
See application file for complete search history.

(56) References Cited

U.S. PATENT DOCUMENTS 4,812,949 A * 3/1989 Fontan et al. ................. 361/719
5,592,021 A * 1/1997 Meschter et al. ............. 257/727
(Continued)

FOREIGN PATENT DOCUMENTS

JP   2005-217093   8/2005
JP   2010-129795   6/2010
(Continued)

OTHER PUBLICATIONS

Non-Final Office Action dated Apr. 22, 2015 for U.S. Appl. No. 13/846,626 (now published as U.S. 2014/0003013).
(Continued)

*Primary Examiner* — Howard Weiss
(74) *Attorney, Agent, or Firm* — NSIP Law

(57) ABSTRACT

Disclosed herein is a power module package including an external connection terminal, a substrate in which a fastening unit allowing one end of the external connection terminal to be insertedly fastened thereinto is formed to penetrate in a thickness direction thereof, and a semiconductor chip mounted on one surface of the substrate.

8 Claims, 14 Drawing Sheets

(51) Int. Cl.
- H01L 21/50 (2006.01)
- H01L 23/373 (2006.01)
- H01L 23/055 (2006.01)
- H01L 23/14 (2006.01)
- H01L 23/492 (2006.01)
- H01L 23/498 (2006.01)
- H01L 25/07 (2006.01)
- H01L 23/00 (2006.01)
- H01L 23/13 (2006.01)

(52) U.S. Cl.
CPC .. *H01L 2224/291* (2013.01); *H01L 2224/2919* (2013.01); *H01L 2224/45124* (2013.01); *H01L 2224/45144* (2013.01); *H01L 2224/45147* (2013.01); *H01L 2224/48091* (2013.01); *H01L 2224/48137* (2013.01); *H01L 2224/48227* (2013.01); *H01L 2224/73265* (2013.01); *H01L 2224/92247* (2013.01); *H01L 2924/1305* (2013.01); *H01L 2924/13034* (2013.01); *H01L 2924/13055* (2013.01); *H01L 2924/13091* (2013.01); *H01L 2924/15787* (2013.01)

(56) References Cited

U.S. PATENT DOCUMENTS

| | | | |
|---|---|---|---|
| 5,920,119 A | 7/1999 | Tamba et al. | |
| 6,297,549 B1 | 10/2001 | Hiyoshi | |
| 6,861,747 B2 * | 3/2005 | Miyazaki et al. | 257/718 |
| 7,663,232 B2 | 2/2010 | Kinsley | |
| 7,706,146 B2 | 4/2010 | Lee et al. | |
| 2004/0051172 A1 | 3/2004 | Miyazaki et al. | |
| 2005/0045369 A1 | 3/2005 | Ishimaru et al. | |
| 2010/0165576 A1 * | 7/2010 | Lee et al. | 361/709 |
| 2012/0127668 A1 | 5/2012 | Yamamoto et al. | |
| 2014/0003013 A1 * | 1/2014 | Yoo et al. | 361/767 |

FOREIGN PATENT DOCUMENTS

| | | |
|---|---|---|
| KR | 10-2007-0103876 | 10/2007 |
| KR | 10-2012-0018781 | 3/2012 |
| KR | 10-2012-0092371 | 8/2012 |
| WO | 2011/016175 | 2/2011 |

OTHER PUBLICATIONS

Non-Final Office Action dated Sep. 3, 2014 for U.S. Appl. No. 13/846,626 (now published as U.S. 2014/0003013).

Restriction Requirement dated May 20, 2014 for U.S. Appl. No. 13/846,626 (now published as U.S. 2014/0003013).

Chinese Office Acton issued on Aug. 5, 2015, in counterpart Chinese Application No. 201210591496.5 (7 pages in English, 7 pages in Chinese).

* cited by examiner

POWER MODULE PACKAGE WITH A FASTENING UNIT INCLUDING A NON-CONDUCTIVE PORTION

CROSS REFERENCE TO RELATED APPLICATION

This application claims the benefit of Korean Patent Application No. 10-2012-0070666, filed on Jun. 29, 2012, entitled "Power Module Package and Method for Manufacturing the Same", which is hereby incorporated by reference in its entirety into this application.

BACKGROUND OF THE INVENTION

1. Technical Field

The present invention relates to a power module package and a method for manufacturing the same.

2. Description of the Related Art

Recently, as electronic industries for power have been developed, electronic products have been increasingly reduced and have higher density. Thus, besides a method of reducing the size of electronic elements, a method of installing elements and conducting wires as many as possible in a determined space is a critical issue in designing a power module package.

Meanwhile, a structure of a related art power module package is disclosed in U.S. Pat. No. 5,920,119.

SUMMARY OF THE INVENTION

The present invention has been made in an effort to provide a power module package and a method for manufacturing the same, capable of eliminating or facilitating a packaging process for coupling an external connection terminal fastening unit to a substrate and preventing a generation of solder cracks between an external connection terminal and a substrate to thus implement high reliability.

According to a preferred embodiment of the present invention, there is provided a power module package including: an external connection terminal; a substrate in which a fastening unit allowing one end of the external connection terminal to be insertedly fastened thereinto is formed to penetrate in a thickness direction thereof; and a semiconductor chip mounted on one surface of the substrate.

The substrate may include: a metal plate; an insulating layer formed on one surface of the metal plate; and a circuit pattern formed on the insulating layer and including a chip mounting pad and an external connection pad, wherein the fastening unit includes a portion made of a conductive material and a portion made of a non-conductive material, wherein the fastening unit is formed in the substrate such that the portion made of a conductive material is in contact with the external connection pad and the portion made of the non-conductive material is in contact with the metal plate.

The substrate may include: a metal plate; an insulating layer formed on one surface of the metal plate; and a circuit pattern formed on the insulating layer and including a chip mounting pad and an external connection pad, wherein the fastening unit may be made of a non-conductive material and the power module package may further include a lead frame electrically connecting the external connection terminal to the external connection pad.

The substrate may include: a metal plate; an insulating layer formed on one surface of the metal plate; and a circuit pattern formed on the insulating layer and including a chip mounting pad and an external connection pad, wherein the fastening unit may include a female screw made of a non-conductive material; and a male screw made of a conductive material and having a recess formed in a length direction to allow the external connection terminal to be inserted thereinto, wherein the male screw may be in contact with the external connection pad.

The fastening unit may include: an upper portion protruded from one surface of the substrate; a central portion positioned within the substrate; and a lower portion buried inwardly from the other surface of the substrate in the thickness direction, wherein a diameter of the central portion is smaller than those of the upper and lower portions.

The power module package may further include: a case formed on the substrate to cover one surface of the substrate and the semiconductor chip and expose the other end of the external connection terminal to the outside.

The power module package may further include: a sealing member formed to cover one surface of the substrate and the semiconductor chip within the case.

The semiconductor chip may be a power element.

According to another preferred embodiment of the present invention, there is provided a method for manufacturing a power module package, including: preparing a substrate having one surface and the other surface and including a circuit pattern formed on one surface thereof and including a chip mounting pad and an external connection pad; forming an opening penetrating the substrate in a thickness direction at a portion in contact with the external connection pad in the substrate; forming a fastening unit in contact with the external connection pad in the opening; mounting a semiconductor chip on the chip mounting pad; and insertedly fastening one end of the external connection terminal into the fastening unit.

In the forming of the opening penetrating the substrate in the thickness direction, the opening may be formed by using a laser drill or a mechanical drill.

The forming of the fastening unit may include: inserting a cylindrical member having a recess formed in a length direction therein into the opening of the substrate; and pressurizing a portion, of the cylindrical member inserted into the opening, protruded from the surface of the substrate.

The substrate may include: a metal plate; an insulating layer formed on one surface of the metal plate; and a circuit pattern formed on the insulating layer and including a chip mounting pad and an external connection pad, wherein the cylindrical member inserted into the opening includes a portion made of a conductive material and a portion made of a non-conductive material, wherein the portion made of a conductive material is in contact with the external connection pad and the portion made of the non-conductive material is in contact with the metal plate.

The substrate may include: a metal plate; an insulating layer formed on one surface of the metal plate; and a circuit pattern formed on the insulating layer and including a chip mounting pad and an external connection pad, wherein the cylindrical member inserted into the opening is made of a non-conductive material, and the method may further include: forming a lead frame for electrically connecting the external connection terminal to the external connection pad, before the insertedly fastening of the external connection terminal into the fastening unit.

The forming of the fastening unit may include: mounting a female screw in the opening; and fastening a male screw having a recess for insertedly fastening the external connection terminal thereon into the female screw in a length direction therein.

The female screw may be made of a non-conductive material, and the male screw may be made of a conductive material.

The method may further include: forming a case on the substrate such that it covers one surface of the substrate and the semiconductor chip and exposes the other end of the external connection terminal to the outside, after the insertedly fastening of the external connection terminal into the fastening unit.

The method may further include: injecting a molding material into the case to form a molding member covering one surface of the substrate and the semiconductor chip, after the forming of the case.

The method may further include: performing a wire bonding process in order to electrically connect the semiconductor chip to the circuit pattern, after the mounting of the semiconductor chip.

BRIEF DESCRIPTION OF THE DRAWINGS

The above and other objects, features and advantages of the present invention will be more clearly understood from the following detailed description taken in conjunction with the accompanying drawings, in which.

DESCRIPTION OF THE PREFERRED EMBODIMENTS

Figure 1:
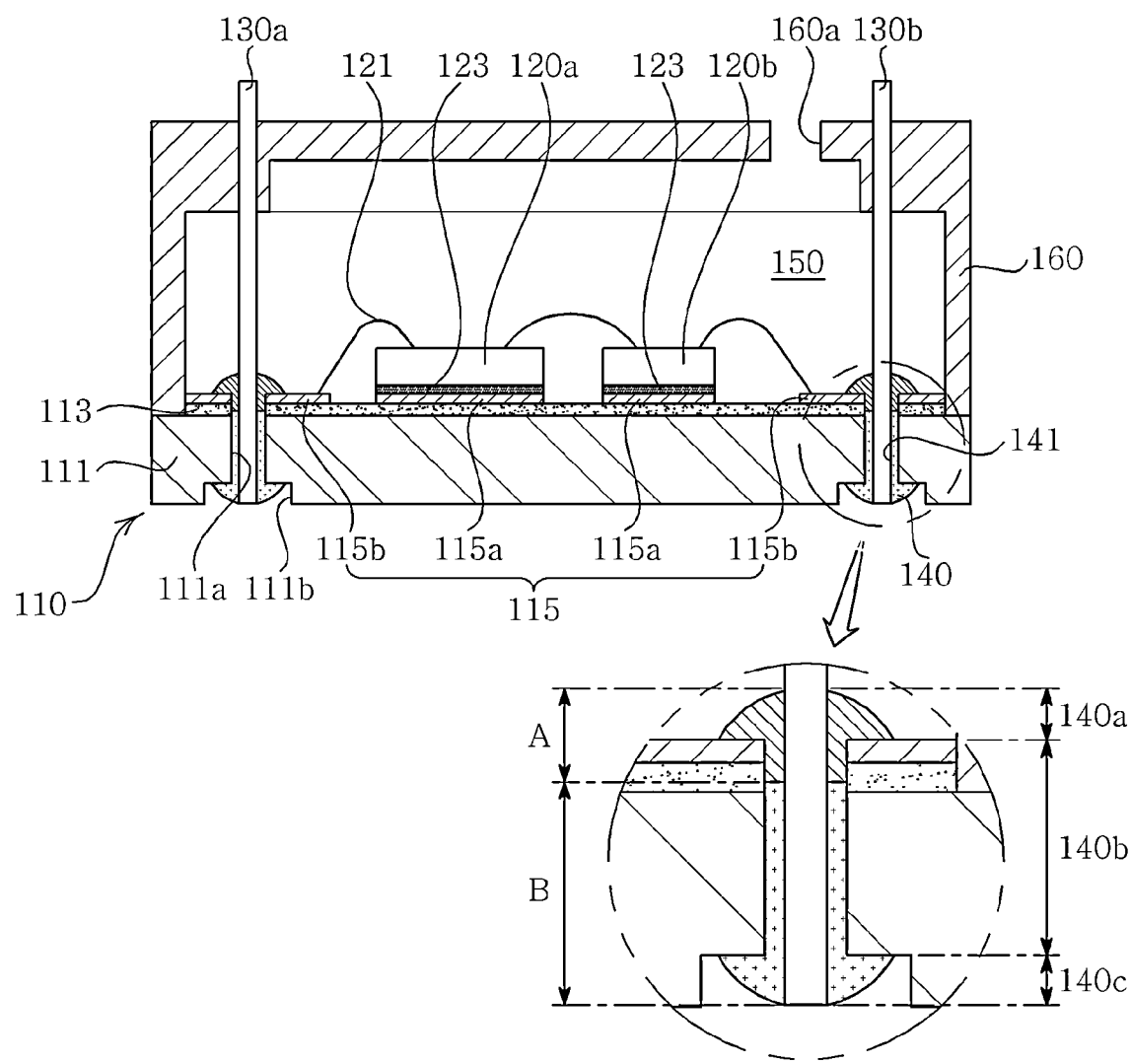
FIG. 1 is a cross-sectional view illustrating a structure of a power module package according to a first embodiment of the present invention.

The objects, features and advantages of the present invention will be more clearly understood from the following detailed description of the preferred embodiments taken in conjunction with the accompanying drawings. Throughout the accompanying drawings, the same reference numerals are used to designate the same or similar components, and redundant descriptions thereof are omitted. Further, in the following description, the terms "first", "second", "one side", "the other side" and the like are used to differentiate a certain component from other components, but the configuration of such components should not be construed to be limited by the terms. Further, in the description of the present invention, when it is determined that the detailed description of the related art would obscure the gist of the present invention, the description thereof will be omitted.

Hereinafter, preferred embodiments of the present invention will be described in detail with reference to the attached drawings.

Power Module Package

First Preferred Embodiment

FIG. 1 is a cross-sectional view illustrating a structure of a power module package according to a first embodiment of the present invention.

With reference to FIG. 1, a power module package 100 according to a first embodiment of the present invention includes external connection terminals 130a and 130b, a substrate 110 including fastening units 140 formed to penetrate in a thickness direction thereof, through which one end of each of the external connection terminals 130a and 130b is insertedly fastened, and semiconductor chips 120a and 120b mounted on one surface of the substrate 110.

In the present embodiment, the substrate 110 may include a metal plate 111, an insulating layer 113 formed on one surface of the metal plate 111, and a circuit pattern 115 formed on the insulating layer 113.

Here, the metal plate 111 may be made of a metal material such as aluminum (Al) or an Al alloy having high thermal conductivity, which is relatively low in price and can be easily obtained, but the present invention is not particularly limited thereto and any material may be employed as long as it has high thermal conductivity.

In the present embodiment, the substrate 110 has one surface and the other surface. Here, based on FIG. 1, one surface of the substrate 110 may refer to a surface on which the semiconductor chips 120a and 120b are mounted, namely, a surface on which the circuit pattern 115 is formed, and the other surface may refer to the opposite surface, namely, a surface from which the metal plate 111 is exposed.

In the present embodiment, the substrate 110 including the metal plate 111, the insulating layer 113, and the circuit pattern 115 is illustrated, but the present invention is not particularly limited thereto and, for example, the substrate may include a metal substrate having an anode oxidation layer, a printed circuit board (PCB), a ceramic substrate, a direct bonded copper (DBC) substrate, and the like.

Also, in the present embodiment, as shown in FIG. 1, the circuit pattern 115 may include a chip mounting pad 115a and an external connection pad 115b, but the present invention is not particularly limited thereto.

The external connection terminals 130a and 130b are components electrically connected to an external driving IC to drive the semiconductor chips 120a and 120b mounted on the substrate 110. In the present embodiment, as shown in FIG. 1, the external connection terminals 130a and 130b are formed as pin type terminals, but the present invention is not particularly limited thereto.

Here, the semiconductor chips 120a and 120b may be power elements. The power elements may include a silicon controlled rectifier (SCR), a power transistor, an insulated gate bipolar transistor (IGBT), a MOS transistor, a power rectifier, a power regulator, an inverter, a converter, or a high power semiconductor chip or a diode configured by combining these elements.

In the present embodiment, a bonding layer 123 may be formed between the semiconductor chips 120a and 120b and the chip mounting pad 115a. In order to effectively dissipate heat, the bonding layer 123 may be made of solder or conductive epoxy having relatively high thermal conductivity, but the present invention is not particularly limited thereto.

Also, in the present embodiment, the semiconductor chips 120a and 120b, the substrate 110, and the external connection terminals 130a and 130b may be electrically connected by using wires 121, but the present invention is not particularly limited thereto.

Here, a wire bonding process may be performed as ball bonding, wedge bonding, and stitch bonding which are well known in the art, but the present invention is not particularly limited thereto.

Here, the wires 121 may be made of aluminum (Al), gold (Al), copper (Cu), and the like, but the present invention is not particularly limited thereto. Wires made of aluminum (Al) applying a high rated voltage to the semiconductor chips 120a and 120b as power elements are generally used. This is because, in order to withstand high voltages, a thick wire is used, and here, the use of aluminum, rather than gold (Au) or copper (Cu), is more effective in terms of cost reduction.

In the present embodiment, the fastening units 140, allowing the external connection terminals 130a and 130b to be insertedly fastened therethrough, is installed to be formed to penetrate in the thickness direction in the substrate 110.

Here, recesses 141 allowing the external connection terminals 130a and 130b to be inserted therethrough may be formed in a length direction within the fastening units 140.

In the present embodiment, as shown in FIG. 1, the fastening units 140 may include an upper portion 140a and a lower portion 140c each having a saucer-like shape and a central portion 140b having a pillar-like shape.

In detail, in the present embodiment, the fastening unit 140 may include the upper portion 140a protruded from one surface of the substrate 110, the central portion 140b positioned within the substrate 110, and the lower portion 140c buried inwardly from the other surface of the substrate 110 in the thickness direction. Here, a diameter of the central portion 140b of the fastening unit 140 may be smaller than that of the upper portion 140a and the lower portion 140c of the fastening unit 140.

This is to fix the fastening unit 140 to the substrate 110 by forming the upper portion 140a and the lower portion 140c of the fastening unit 140 to have a diameter greater than that of an opening 111a formed in the substrate 110.

Also, in the present embodiment, in order to prevent the lower portion 140c of the fastening unit 140 from being protruded from the surface of the substrate 110, a recess portion 111b may be formed on a corresponding portion. The recess portion 111b is formed to be connected to the opening 111a.

Accordingly, since the lower portion 140c of the fastening unit 140 is positioned in the recess portion 111b so as not to protrude from the substrate 110, a heat sink may be easily attached to the other surface of the substrate 110 in a follow-up process.

In the present embodiment, the fastening unit 140 may include a portion A made of a conductive material and a portion B made of a non-conductive material.

Namely, as shown in FIG. 1, the portion protruded from one surface of the substrate 110 so as to be in contact with the external connection pad 115b is made of a conductive material, while the portion in contact with the metal plate 111, among the components of the substrate 110, is made of a non-conductive material in order to avoid a problem such as a short, or the like.

Thus, without any additional component for electrically connecting the external connection terminals 130a and 130b to the external connection pads 115b, the external connection terminals 130a and 130b and the external connection pads 115b may be electrically connected by the fastening units 140 made of a conductive material.

The power module package 100 according to the present embodiment may further include a case 160 formed on the substrate 110 to cover one surface of the substrate 110 and semiconductor chips 120a and 120b and expose the other ends of the external connection terminals 130a and 130b to the outside.

Here, the case 160 may include an open region 160a allowing a molding material to be injected into the case 160 therethrough.

Also, the power module package 100 according to the present embodiment may further include a sealing member 150 formed to cover one surface of the substrate 110, the semiconductor chips 120a and 120b, and the wires 121 electrically connecting the semiconductor chips 120a and 120b.

Here, a silicon gel, an epoxy molded compound (EMC), or the like, may be used as a material of the sealing member 150, but the present invention is not particularly limited thereto.

Also, although not shown, the power module package 100 according to the present embodiment may further include a heat sink bonded to the other surface of the substrate 110, namely, the exposed portion of the metal plate 111.

The heat sink may include a plurality of heat dissipation fins for dissipating heat generated from the semiconductor chips 120a and 120b into the air.

Also, the heat sink is generally made of or coated with copper (Cu) or tin (Sn) in order to obtain excellent heat transmission and be easily bonded with a heat dissipation substrate. However, the present invention is not particularly limited thereto.

In the present embodiment, since the fastening units 140 for insertedly fastening the external connection terminals 130a and 130b are formed to be installed in the substrate 110, a possibility of generating cracks at the bonded interface may be prevented in comparison to the related art in which a member for connecting an external connection terminal is bonded to a substrate through soldering, and thus, reliability of the product can be enhanced.

Second Preferred Embodiment

Figure 2:
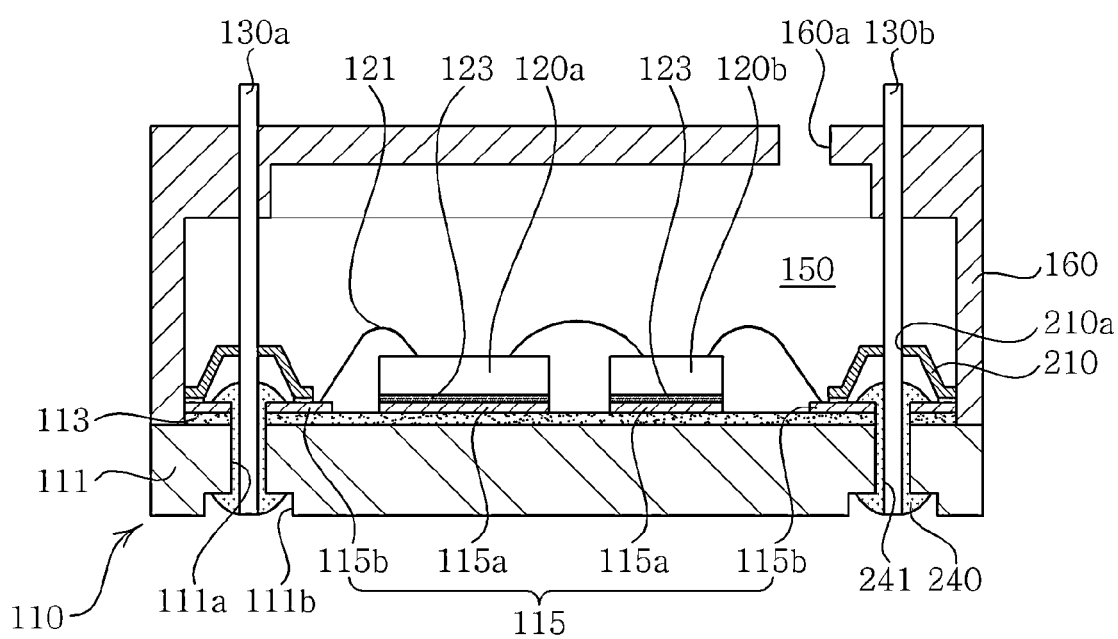
FIG. 2 is a cross-sectional view illustrating a structure of a power module package according to a second embodiment of the present invention.

FIG. 2 is a cross-sectional view illustrating a structure of a power module package according to a second embodiment of the present invention.

In the second embodiment, a description of the same components as those of the first embodiment described above will be omitted and the same reference numerals will be used for the same components as those of the first embodiment.

With reference to FIG. 2, like the first embodiment, a power module package 200 according to the present embodiment includes the external connection terminals 130a and 130b, the substrate 110 including fastening units 240 formed to penetrate in a thickness direction thereof, through which one end of each of the external connection terminals 130a and 130b is insertedly fastened, and the semiconductor chips 120a and 120b mounted on one surface of the substrate 110.

Here, the power module package 200 may further include lead frames 210 for electrically connecting the external connection terminals 130a and 130b to the external connection pads 115b.

In the present embodiment, unlike the fastening units 140 according to the first embodiment, fastening units 240 are entirely made of a non-conductive material.

The external connection terminals 130a and 130b insertedly fastened into the fastening units 240 made of a non-conductive material are not electrically connected to the external connection pads 115b, so the lead frames 210 are additionally bonded to electrically connect them.

Here, the lead frames 210 and the external connection pads 115*b* may be bonded by using solder or a conductive epoxy, but the present invention is not particularly limited thereto.

Also, although not shown, holes 210*a* allowing the external connection terminals 130*a* and 130*b* to penetrate therethrough may be formed in the lead frames 210, and one end of each of the external connection terminals 130*a* and 130*b* may be insertedly fastened into the fastening units 240 through the holes 210*a* of the lead frame 210.

Here, solder or a conductive epoxy may be additionally formed on the portions in which the external connection terminals 130*a* and 130*b* and the lead frames 210 are in contact, namely, on the holes 210*a* of the lead frames 210 and the external connection terminals 130*a* and 130*b*, to increase bonding force.

Third Preferred Embodiment

Figure 3:
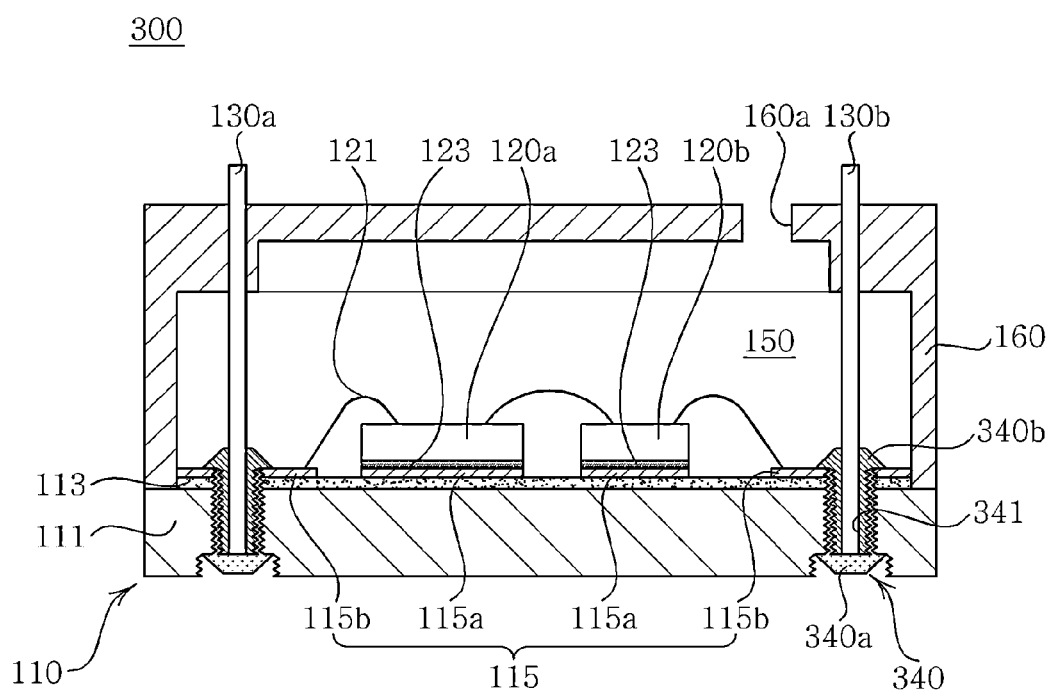
FIG. 3 is a cross-sectional view illustrating a structure of a power module package according to a third embodiment of the present invention.

FIG. 3 is a cross-sectional view illustrating a structure of a power module package according to a third embodiment of the present invention.

In the third embodiment, a description of the same components as those of the first embodiment described above will be omitted and the same reference numerals will be used for the same components as those of the first embodiment.

With reference to FIG. 3, like the first embodiment, a power module package 300 according to the present embodiment includes the external connection terminals 130*a* and 130*b*, the substrate 110 including fastening units 340 formed to penetrate in a thickness direction thereof, through which one end of each of the external connection terminals 130*a* and 130*b* is insertedly fastened, and the semiconductor chips 120*a* and 120*b* mounted on one surface of the substrate 110.

In the present embodiment, as shown in FIG. 3, a fastening unit 340 may includes a female screw 340*a* mounted in the opening 111*a* formed in the substrate 110 and a male screw 340*b* fastened to the female screw 340*a* and having a recess 341 for an insertion of the external connection terminal 130*a* or 130*b* formed in a length direction therein.

Here, the female screw 340*a* may be made of a non-conductive material, and the male screw 340*b* may be made of a conductive material, but the present invention is not particularly limited thereto.

However, since the female screw 340*a* is in direct contact with the metal plate 111 of the substrate 110 in terms of structure, so preferably, the female screw 340*a* is made of a non-conductive material in order to prevent a short.

The male screw may be made of a conductive material so as to electrically connect the external connection terminals 130*a* and 130*b* to the external connection pad 115*b* without the necessity of an additional component for electrically connecting the external connection terminals 130*a* and 130*b* to the external connection pad 115*b*.

Namely, as shown in FIG. 3, since a head portion of the male screw 340*b* is in contact with the external connection pad 115*b*, the external connection terminals 130*a* and 130*b* insertedly fastened into the recess 341 of the male screw 340*b* made of a conductive material may be electrically connected to the external connection pad 115*b*.

Meanwhile, if the male screw 340*b* is made of a non-conductive material, like the case of the foregoing second embodiment, a component, e.g., a lead frame, for electrically connecting the external connection terminals 130*a* and 130*b* to the external connection pad 115*b* should be additionally provided.

In the present embodiment, the female screw 340*a* and the male screw 340*b* having the recess 341 for an insertion of the external connection terminals 130*a* and 130*b* are provided as fastening units 340, but only the female screw 340*a* is provided and a screw thread corresponding to a thread groove formed within the female screw 340*a* may be formed on a portion of the external connection terminals 130*a* and 130*b* inserted into the female screw 340*a*, so that the external connection terminals 130*a* and 130*b* may be directly fastened to the male screw 340*a* in a screw manner.

Method for Manufacturing Power Module Package

First Preferred Embodiment

FIGS. 4 through 11 are cross-sectional views sequentially illustrating a method for manufacturing a power module package according to the first embodiment of the present invention.

Figure 4:
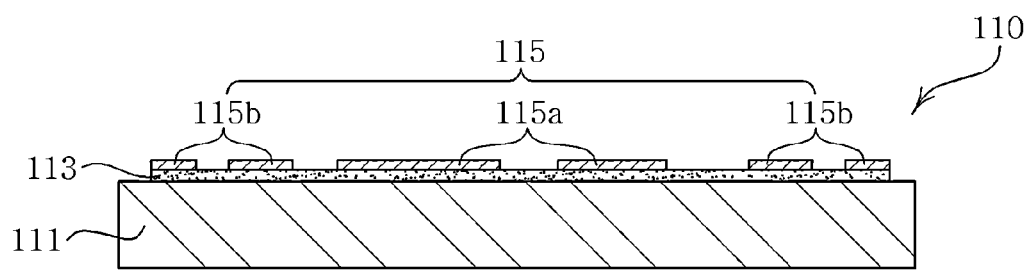
FIGS. 4 through 11 are cross-sectional views sequentially illustrating a method for manufacturing a power module package according to the first embodiment of the present invention.

First, with reference to FIG. 4, the substrate 110 having a circuit pattern 115 including a chip mounting pad 115*a* and an external connection pad 115*b* formed on one surface thereof is prepared.

In the present embodiment, the substrate 110 may include the metal plate 111, the insulating layer 113 formed on one surface of the metal plate 111, and the circuit pattern 115 formed on the insulating layer 113, but the present invention is not particularly limited thereto.

Here, the metal plate 111 may be made of a metal material such as aluminum (Al) or an Al alloy, which is relatively low in price and can be easily obtained, but the present invention is not particularly limited thereto and any material may be employed as long as it has high thermal conductivity.

In the present embodiment, the substrate 110 has one surface and the other surface. Here, based on FIG. 1, one surface of the substrate 110 may refer to a surface on which the to semiconductor chips 120*a* and 120*b* are mounted, namely, a surface on which the circuit pattern 115 is formed, and the other surface may refer to the opposite surface, namely, a surface from which the metal plate 111 is exposed.

Figure 5:
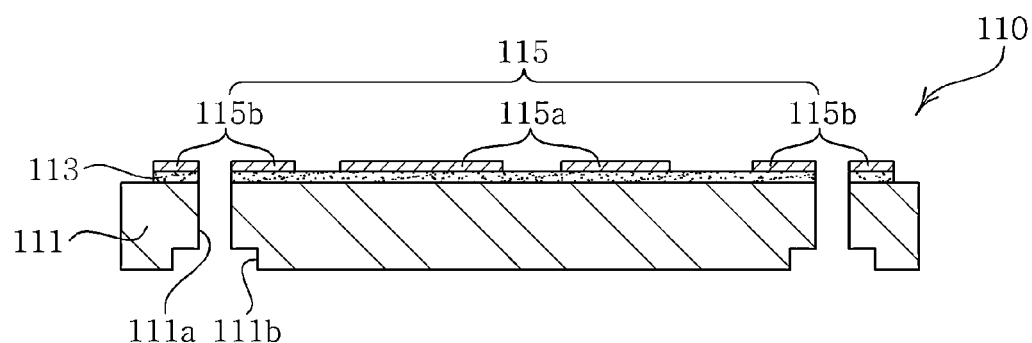

Next, with reference to FIG. 5, the opening 111*a* penetrating the substrate 110 in the thickness direction is formed.

In the present embodiment, the opening 111*a* may be formed by using a laser drill or a mechanical drill, but the present invention is not particularly limited thereto.

Also, in the present embodiment, as shown in FIG. 5, in forming the opening 111*a*, the recess portion 111*b* having a diameter greater than that of the opening 111*a* by a certain depth in an inward direction may be formed on the other surface of the substrate 110. Here, the opening 111*a* and the recess portion 111*b* are connected into one.

Accordingly, the lower portion 140*c* of the fastening unit 140 is not protruded from the other surface of the substrate 110 in forming the fastening unit 140 in a follow-up process, to thus facilitate bonding of a heat sink to the other surface of the substrate to enhance heat dissipation.

Figure 6:
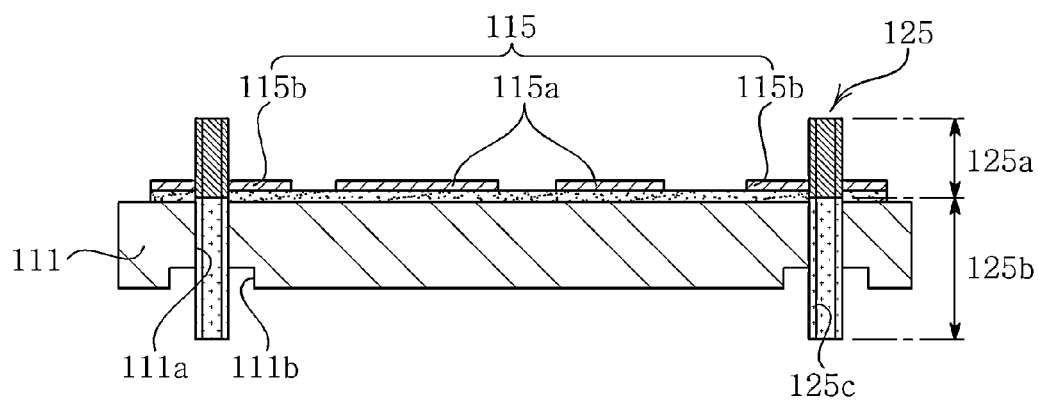

Thereafter, with reference to FIG. 6, a cylindrical member 125 is inserted into the opening 111*a*.

Here, as shown in FIG. 6, the cylindrical member 125 may include a portion 125*a* made of a conductive material and a portion 125*b* made of a non-conductive material.

Also, a recess 125*c* may be formed in a length direction within the cylindrical member 125.

Figure 7:
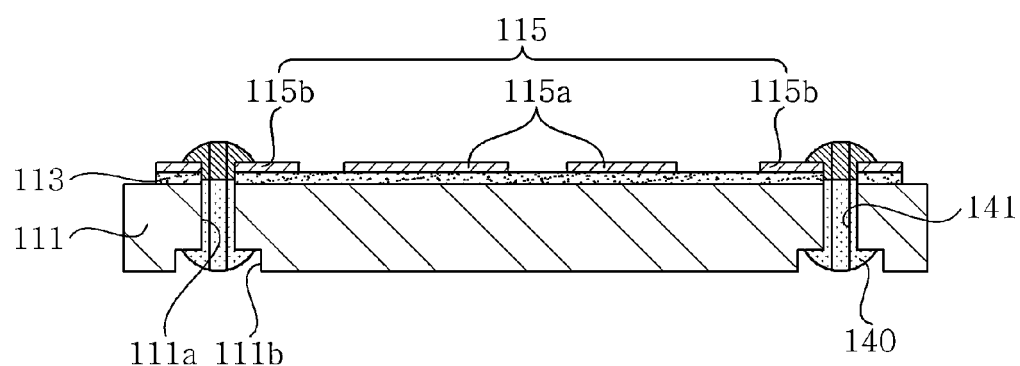

And then, with reference to FIG. 7, portions, e.g., upper and lower portions, of the cylindrical member 125 inserted into the opening 111*a*, protruded from the substrate 110 are simultaneously pressurized so as to be deformed to form the fastening unit 140.

Namely, as shown in FIG. 7, portions other than the central portion of the cylindrical member 125 positioned in the opening 111a, namely, the portions protruded from the substrate 110, are pressurized in the arrow direction such that they are deformed to have a saucer-like shape having a diameter greater than that of the central portion, thus forming the fastening unit 140 that may be fixed in the substrate 110.

In this manner, since the opening 111a penetrating the substrate 110 in the thickness direction is processed and then the fastening unit 140 is formed in the opening 111a, the fastening unit 140 may be formed in a relatively accurate position in comparison to the related art fastening unit bonding method using soldering.

Thus, since the fastening unit 140 may be formed relatively in the same position in each module, external connection terminal inserting process may also be smoothly performed.

Figure 8:
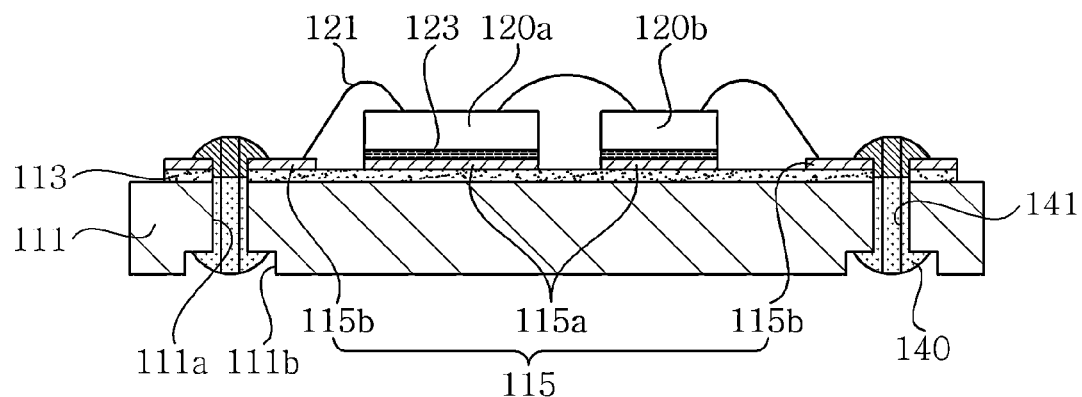

Thereafter, with reference to FIG. 8, the semiconductor chips 120a and 120b are mounted on the chip mounting pad 115a of the substrate 110.

Here, the semiconductor chips 120a and 120b may be bonded to the chip mounting pad 115a by using solder, a conductive epoxy, or the like, but the present invention is not particularly limited thereto.

Also, in order to electrically connect the semiconductor chips 120a and 120b to the chip mounting pad 115a and the external connection pad 115b on the substrate 110, wire bonding process may be performed.

Here, the wire bonding process may include ball bonding, wedge bonding, and stitch bonding, which are well known in the art, but the present invention is not particularly limited thereto.

Here, the wires 121 may be made of aluminum (Al), gold (Al), copper (Cu), and the like, but the present invention is not particularly limited thereto. Wires made of aluminum (Al) applying a high rated voltage to the semiconductor chips 120a and 120b as power elements are generally used. This is because, in order to withstand high voltages, a thick wire is used, and here, the use of aluminum, rather than gold (Au) or copper (Cu), is more effective in terms of cost reduction.

Figure 9:
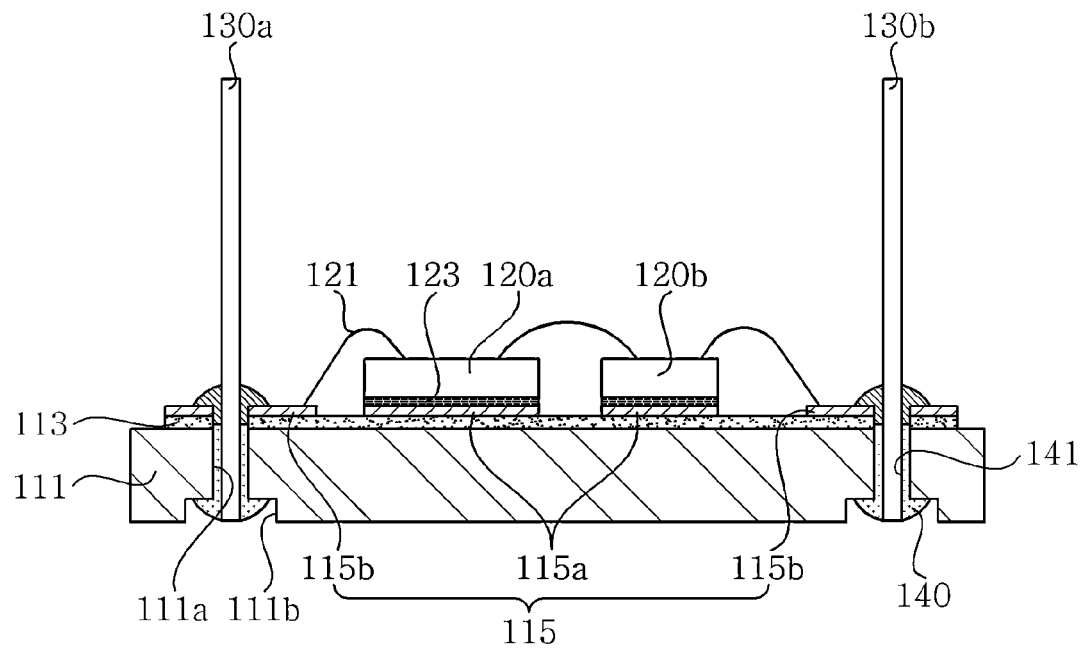

With reference to FIG. 9, the external connection terminals 130a and 130b are insertedly fastened into the recesses 141 formed in a length direction within the fastening units 140.

Here, in order to enhance fastening force between the external connection terminals 130a and 130b and the fastening units 140, a stop recess (or stop projection) (not shown) may be formed within the recesses 141 of the fastening units 140, and a fastening projection (or a fastening recess) (not shown) corresponding to the stop recess (or stop projection) (not shown) may be formed on inserted portions of the external connection terminals 130a and 130b, but the present invention is not particularly limited thereto.

Figure 10:
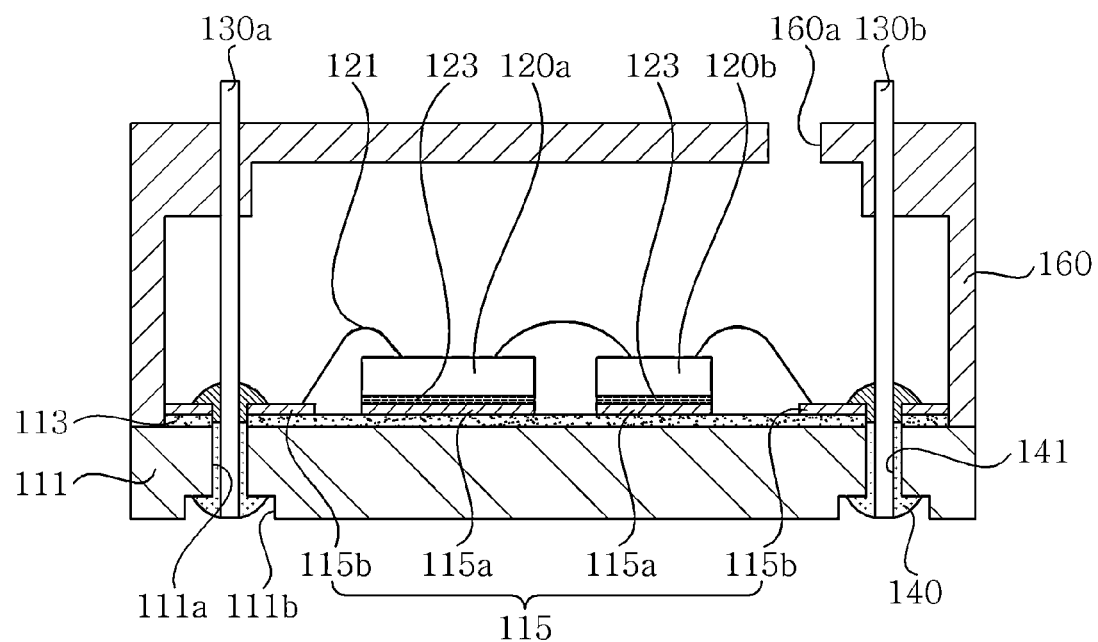

And then, with reference to FIG. 10, the case 160 is formed on the substrate 110 with the semiconductor chips 120a and 120b mounted thereon and the external connection terminals 130a and 130b insertedly fastened thereinto to cover one surface of the substrate 110 and semiconductor chips 120a and 120b and expose the other ends of the external connection terminals 130a and 130b to the outside.

Here, the case 160 may include an open region 160a allowing a molding material to be injected into the case 160 therethrough.

Figure 11:
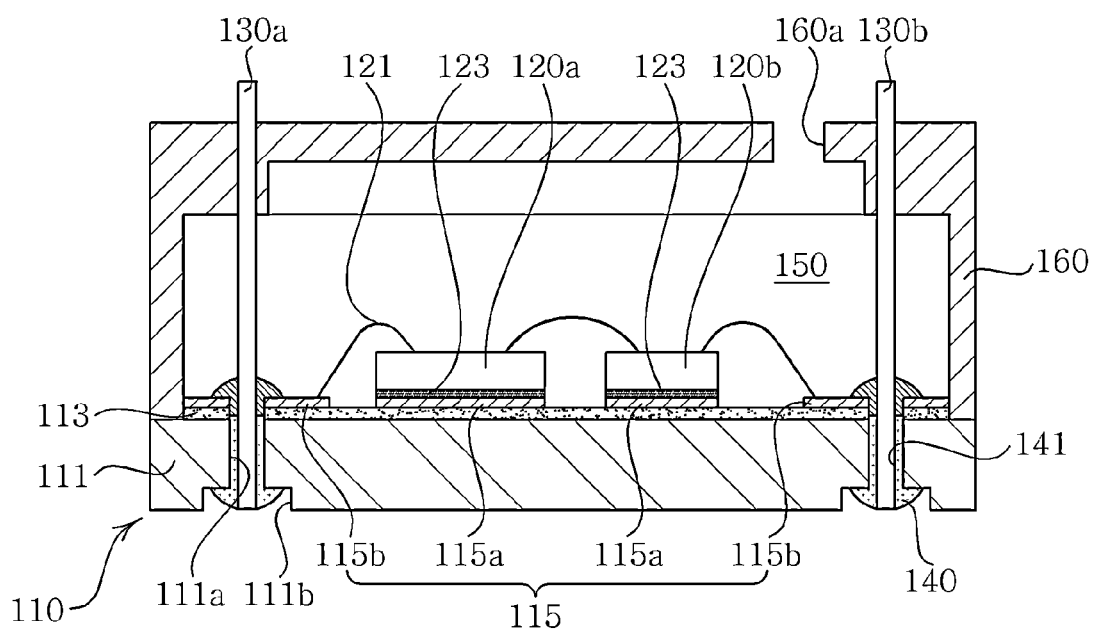

Thereafter, with reference to FIG. 11, the interior of the case 160 is charged with a molding material through the open region 160a to form the sealing member 150 covering one surface of the substrate 110 and the semiconductor chips 120a and 120b.

Here, a silicon gel, an epoxy molded compound (EMC), or the like, may be used as a material of the sealing member 150, but the present invention is not particularly limited thereto.

Second Preferred Embodiment

FIGS. 12 through 19 are cross-sectional views sequentially illustrating a method for manufacturing a power module package according to the second embodiment of the present invention.

In the second embodiment, a description of the same components as those of the first embodiment described above will be omitted and the same reference numerals will be used for the same components as those of the first embodiment.

Figure 12:
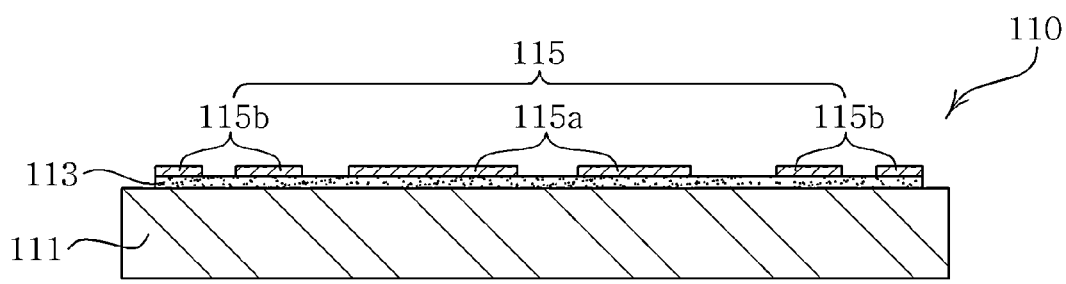
FIGS. 12 through 19 are cross-sectional views sequentially illustrating a method for manufacturing a power module package according to the second embodiment of the present invention.
Figure 13:
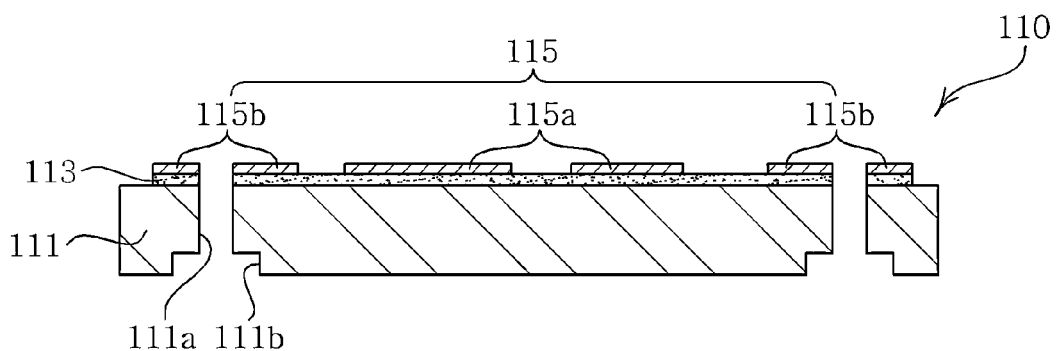
Figure 14:
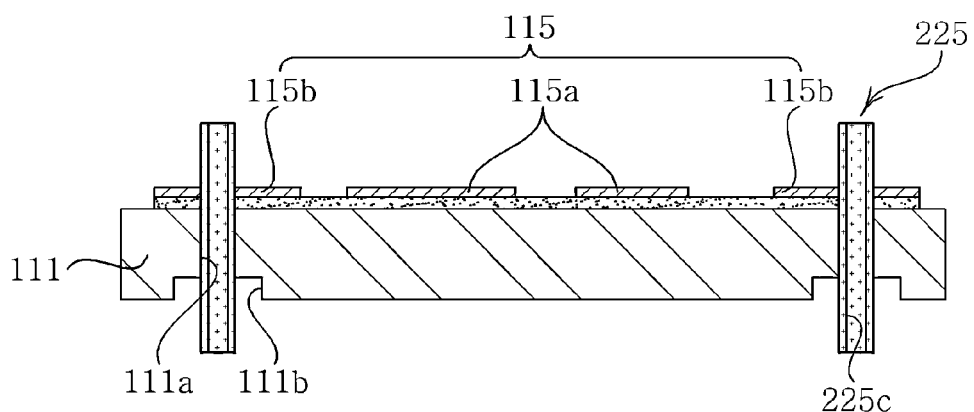

With reference to FIGS. 12 to 14, after the opening 111a penetrating the substrate 110 in the thickness direction is formed in the substrate 110 having the circuit pattern 115 including the chip mounting pad 115a and the external connection pad 115b, the cylindrical member 225 having a recess 225c formed in the length direction is inserted into the opening 111a.

Unlike the foregoing first embodiment, in the present embodiment, the cylindrical member 225 may be entirely made of a non-conductive material.

Figure 15:
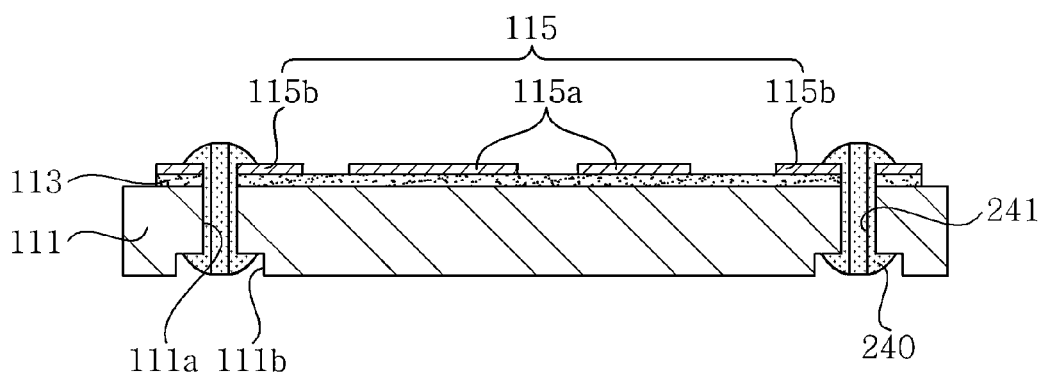

Next, with reference to FIG. 15, like the foregoing first embodiment, the upper and lower portions of the cylindrical member 225 inserted into the opening 111a of the substrate 110 are pressurized in the arrow direction so as to be deformed to form the fastening units 240.

Figure 16:
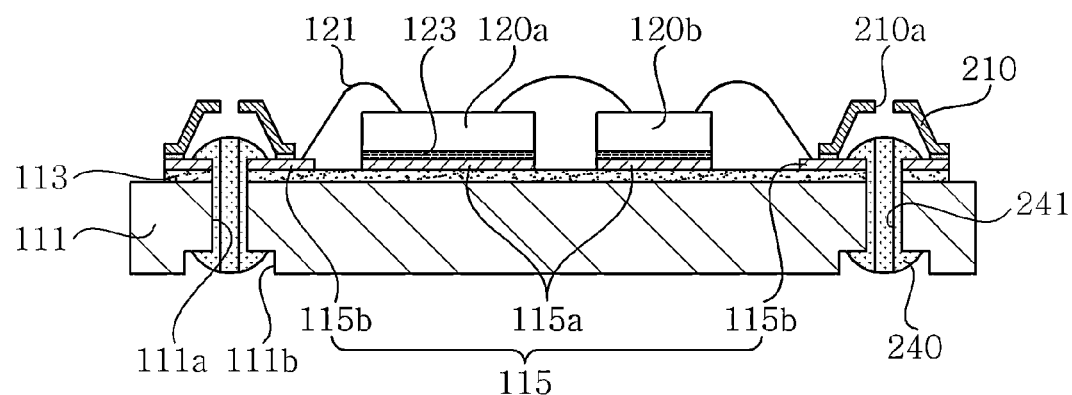
Figure 17:
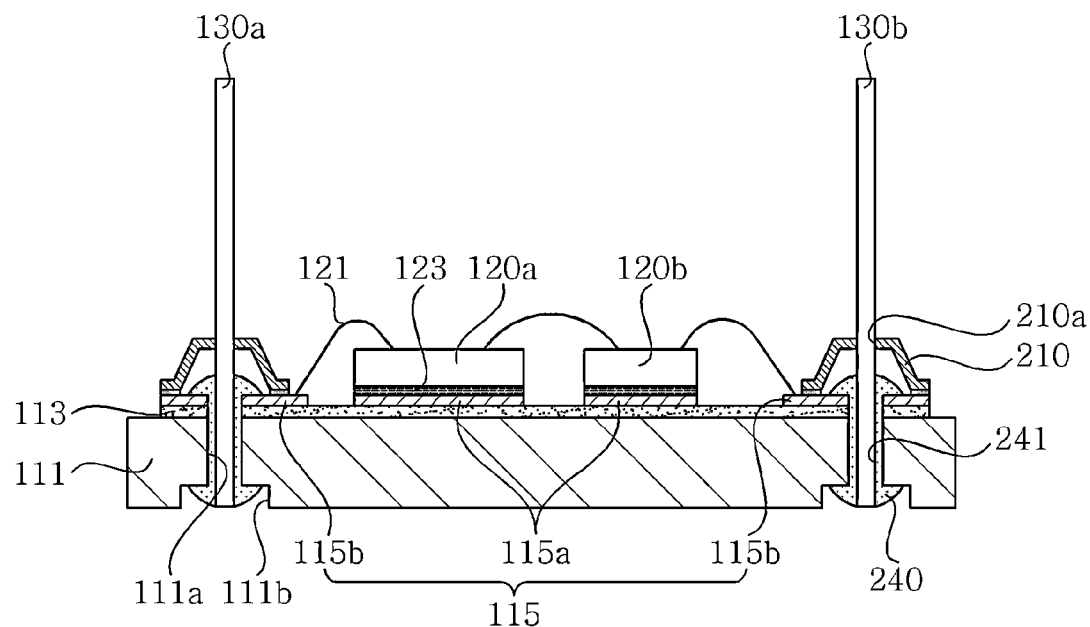

Thereafter, with reference to FIG. 16, the semiconductor chips 120a and 120b are mounted on the chip mounting pad 115a, and the lead frame 210 is bonded to the external connection pad 115b.

Here, the semiconductor chips 120a and 120b and the chip mounting pad 115a, and the lead frame 210 and the external connection pad 115b may be bonded by using solder or a conductive epoxy, but the present invention is not particularly limited thereto.

As shown in FIG. 16, a hole 210a may be formed at a central portion between the lead frames 210 used in the present embodiment.

The hole 210a is a portion allowing the external connection terminals 130a and 130b to pass therethrough in a follow-up process. The position of the hole 210a corresponds to the position of the recess 241 of the fastening unit 240, and a diameter of the hole 210a may be equal to that of the recess 241 of the fastening unit 240 and those of the external connection terminals 130a and 130b, but the present invention is not particularly limited thereto. Thereafter, with reference to FIG. 17, one end of each of the external connection terminals 130a and 130b is insertedly fastened into the recess 241 of the fastening unit 240 through the hole 210a of the lead frame 210.

Here, in order to enhance fastening force, a stop recess (or stop projection) (not shown) may be formed within the recess 241 of the fastening units 240, and a fastening projection (or a fastening recess) (not shown) corresponding to the stop recess (or stop projection) (not shown) may be formed on the external connection terminals 130a and 130b inserted thereinto.

Thereafter, although not shown, in order to enhance bonding force between the external connection terminals 130a and 130b and the lead frames 210 in contact therewith, the hole 210a portions of the lead frames 210 and the external connection terminals 130a and 130b penetrating the holes 210a may be bonded with solder or a conductive epoxy.

Figure 18:
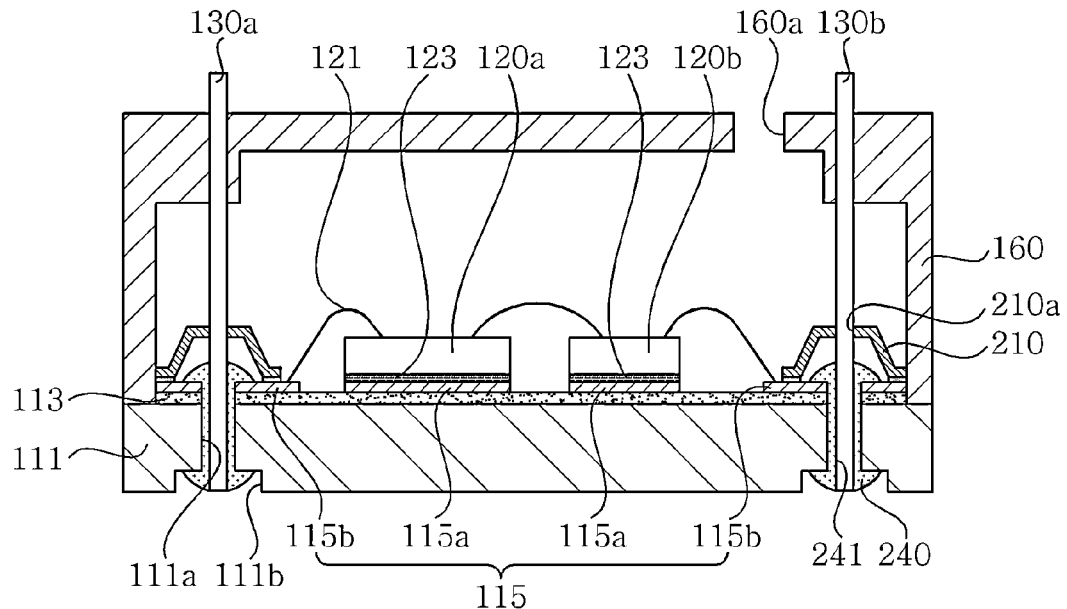
Figure 19:
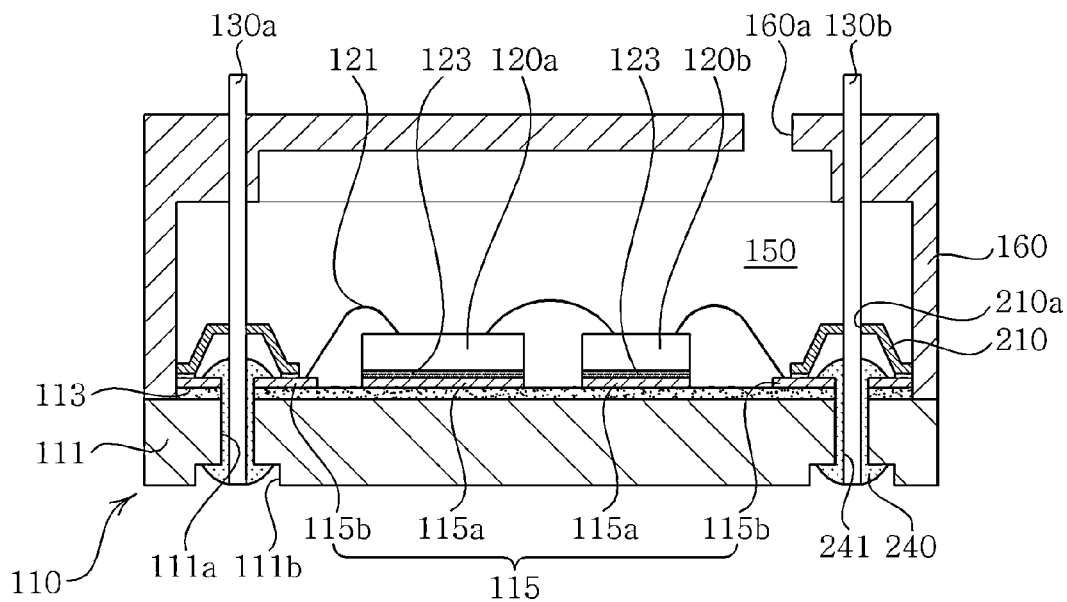
Figure 20:
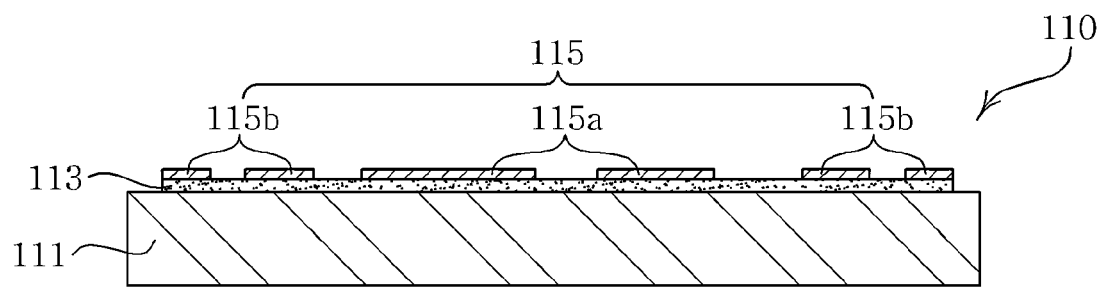
FIGS. 20 through 27 are cross-sectional views sequentially illustrating a method for manufacturing a power module package according to the third embodiment of the present invention.

Thereafter, with reference to FIGS. 18 and 19, the case 160 is formed on the substrate 110, and a molding material is injected through the open region 160a of the case 160 to form the molding member 150 covering one surface of the substrate and the semiconductor chips 120a and 120b.

Third Preferred Embodiment

FIGS. 20 through 27 are cross-sectional views sequentially illustrating a method for manufacturing a power module package according to the third embodiment of the present invention.

In the third embodiment, a description of the same components as those of the first embodiment described above will be omitted and the same reference numerals will be used for the same components as those of the first embodiment.

Figure 21:
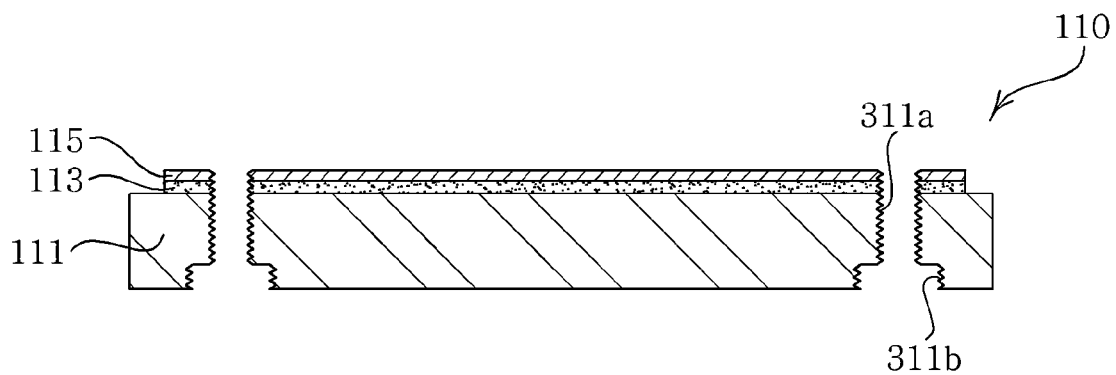

First, with reference to FIG. 21, an opening 311a penetrating the substrate 110 in the thickness direction is formed in the substrate 110 having the circuit pattern 115 including the chip mounting pad 115a and the external connection pad 115b.

In the present embodiment, the opening 311a may be processed by using a laser drill or a mechanical drill, but the present invention is not particularly limited thereto.

Also, in the present embodiment, when the opening 311a is processed, the opening 311a may be processed such that depressions and protrusions are formed on inner walls thereof.

This is to enhance bonding force between a female screw 340a to be insertedly mounted in the opening 311a and the substrate 110 in a follow-up process.

Also, in the present embodiment, a portion 311b connected to the opening 311a on the other surface of the substrate 110 may be formed to have a diameter greater than that of the opening 311a.

This is to prevent a head portion of the female screw 340a from being protruded from the other surface of the substrate 110 when the female screw 340a, which has a head portion having a diameter greater than that of a body portion thereof, is mounted in the opening 311a.

Figure 22:
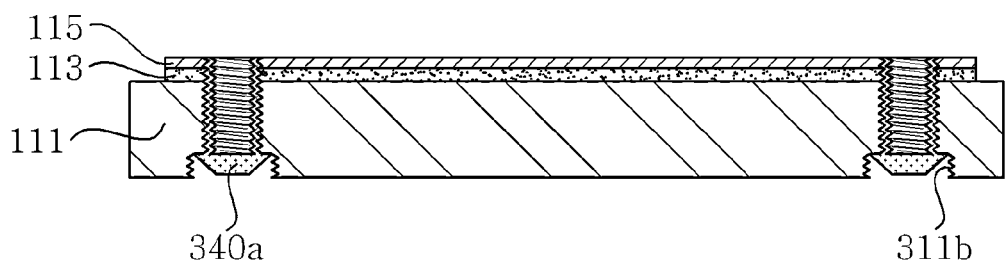

Thereafter, with reference to FIG. 22, the female 340a is mounted in the opening 311a formed in the substrate 110.

Here, spiral grooves may be formed on inner walls of the female screw 340a.

Also, in the present embodiment, the female screw 340a may be made of a non-conductive material, but the present invention is not particularly limited thereto.

Here, when the substrate 110 including the metal plate 111 is used, if the female screw 340a is made of a conductive material, a short may occur, so the female screw 340a is preferably made of a non-conductive material.

Figure 23:
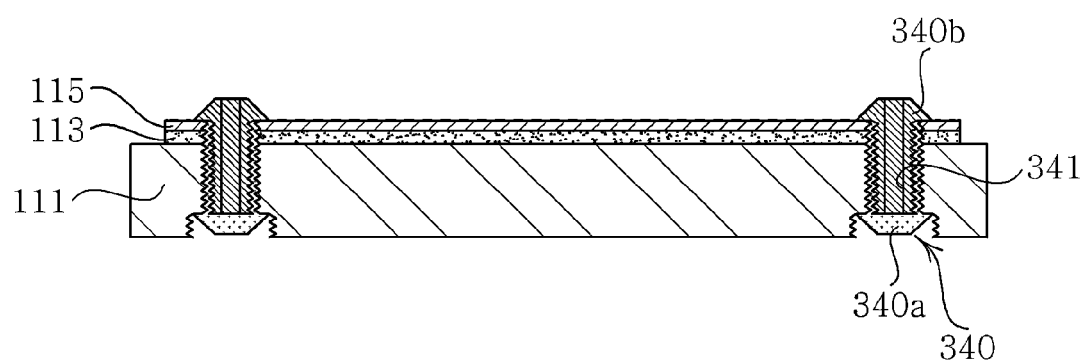

Thereafter, with reference to FIG. 23, the male screw 340b is coupled to the female screw 340a.

Here, the recess 341 allowing the external connection terminals 130a and 130b to be inserted therein may be formed in a length direction within the male screw 340b.

Also, in the present embodiment, the male screw 340b may be made of a conductive material, but the present invention is not particularly limited thereto.

However, when the male screw 340b is made of a conductive material, the external connection terminals 130a and 130b may be electrically connected to the external connection pads 115b by insertedly fastening the external connection terminals 130a and 130b into the recesses 341 of the male screws 340b without the necessity of a component for electrically connecting the external connection terminals 130a and 130b to the external connection pads 115b.

Namely, as shown in FIG. 23, since the head portions of the male screw 340b is in contact with the external connection pads 115b, the external connection terminals 130a and 130b insertedly fastened into the recesses 341 of the male screws 340b made of a conductive material may be electrically connected to the external connection pads 115b.

Meanwhile, when the male screws 340b are made of a non-conductive material, a component, for example, a lead frame, or the like, may be additionally provided to electrically connect the external connection terminals 130a and 130b to the external connection pads 115b like the second embodiment as described above.

Figure 24:
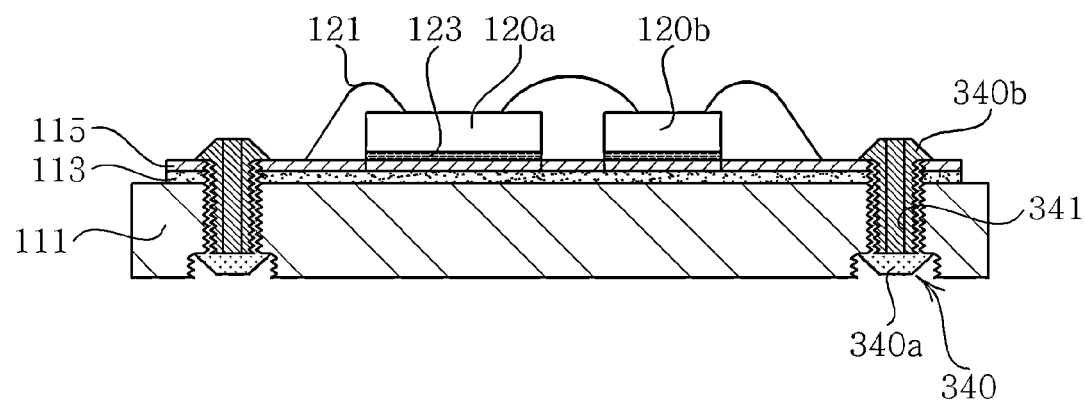

Thereafter, with reference to FIG. 24, the semiconductor chips 120a and 120b are mounted on the chip mounting pad 115a of the substrate 110.

Here, the semiconductor chips 120a and 120b may be bonded to the chip mounting pad 115a by using solder, a conductive epoxy, or the like, but the present invention is not particularly limited thereto.

Also, the semiconductor chips 120a and 120b may be electrically connected to the circuit pattern 115 through wire bonding.

Figure 25:
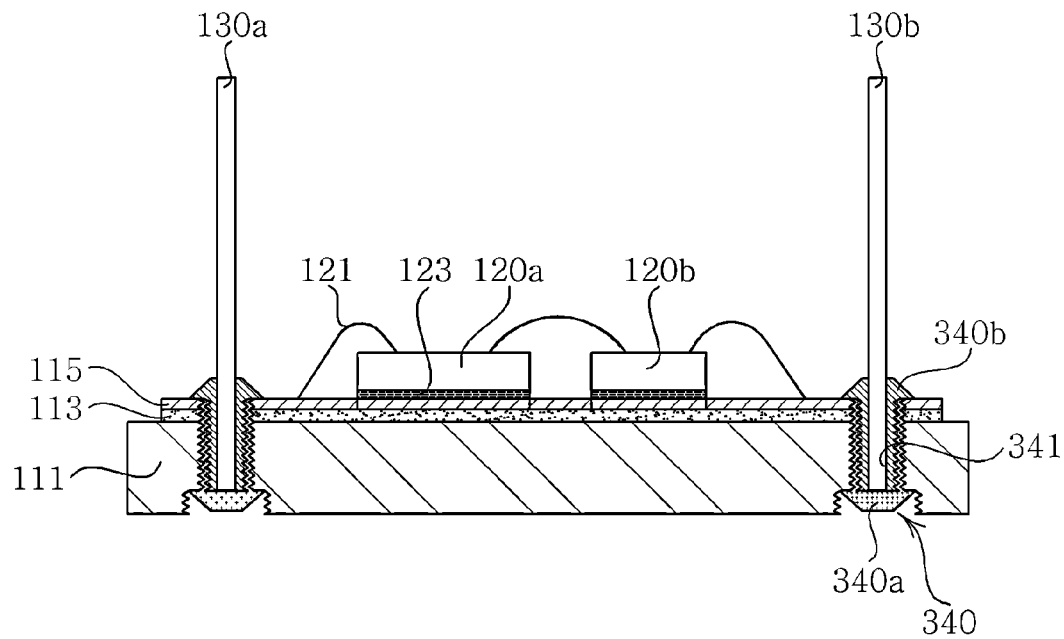

Thereafter, with reference to FIG. 25, one end of each of the external connection terminals 130a and 130b is insertedly fastened into the recess 341 of the male screw 340b.

Here, in order to enhance fastening force, a stop recess (or stop projection) (not shown) may be formed within the recess 341 of the male screw 340b, and a fastening projection (or a fastening recess) (not shown) corresponding to the stop recess (or stop projection) (not shown) may be formed on the external connection terminals 130a and 130b inserted thereinto.

Figure 26:
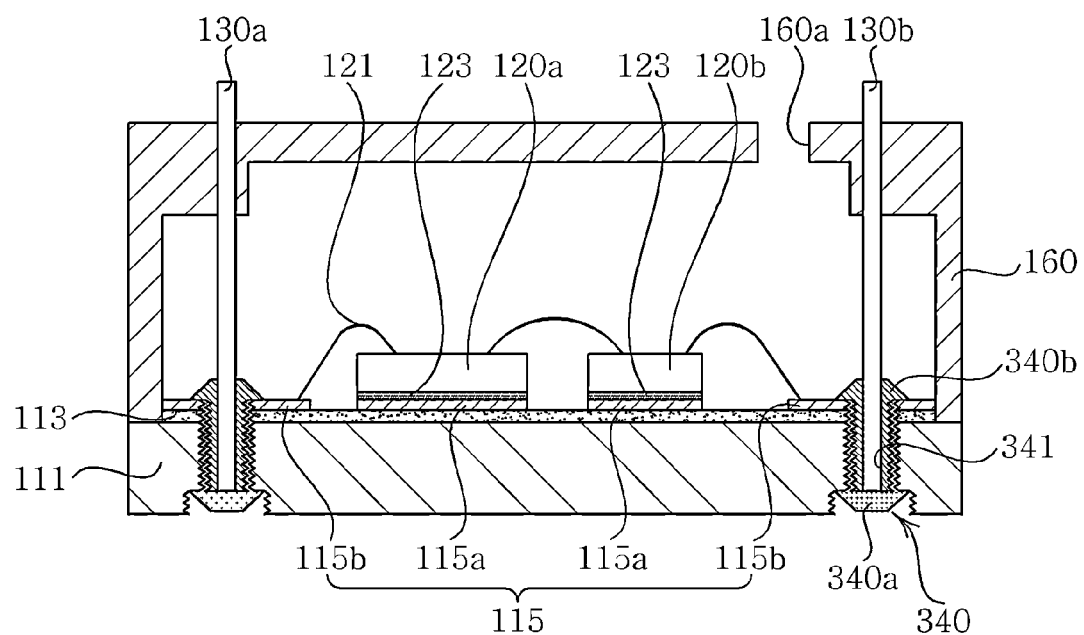
Figure 27:
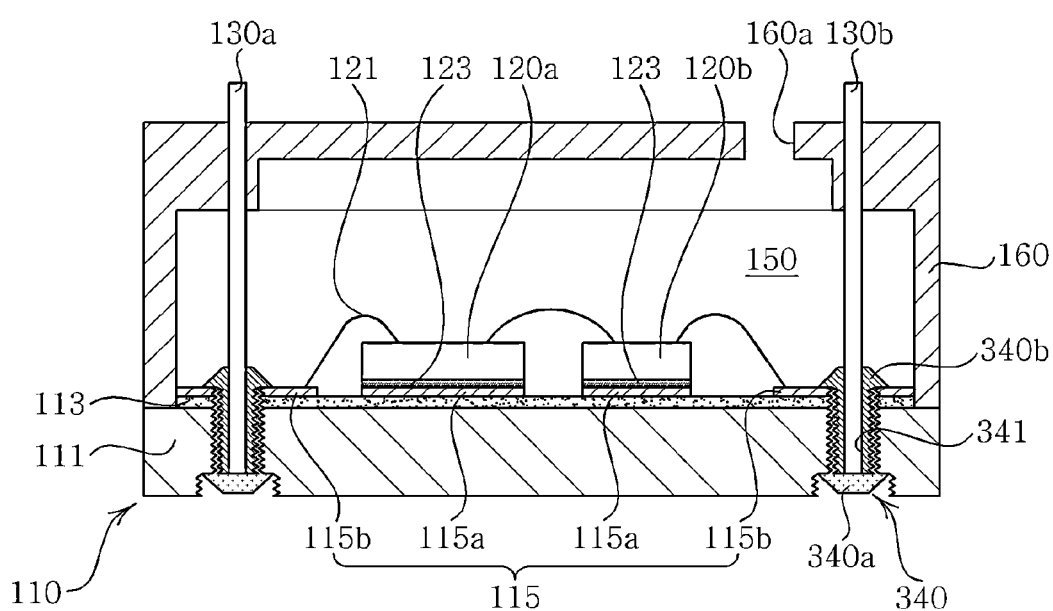

Thereafter, with reference to FIGS. 26 and 27, the case 160 is formed on the substrate 110, and a molding material is injected through the open region 160a of the case 160 to form the molding member 150 covering one surface of the substrate and the semiconductor chips 120a and 120b.

According to the preferred embodiments of the present invention, since a process for bonding a unit for fastening an external connection terminal to the substrate is not necessary, the number of processes can be reduced, simplifying the processes.

Also, since the fastening unit for inserting the external connection terminal is installed within the substrate, positions of fastening units are relatively uniform in manufacturing respective products, and thus, the external connection terminals can be easily fastened.

In addition, since the fastening unit for inserting the external connection terminal is installed in the substrate, there is no possibility that cracks are generated in the interface of the substrate and the fastening unit in comparison to the related art fastening unit mounted on the substrate through soldering, enhancing reliability of the product.

Although the embodiments of the present invention have been disclosed for illustrative purposes, it will be appreciated that the present invention is not limited thereto, and those skilled in the art will appreciate that various modifications, additions and substitutions are possible, without departing from the scope and spirit of the invention.

Accordingly, any and all modifications, variations or equivalent arrangements should be considered to be within the scope of the invention, and the detailed scope of the invention will be disclosed by the accompanying claims.

What is claimed is:

1. A power module package comprising:
   an external connection terminal;
   a substrate in which a fastening unit allowing one end of the external connection terminal to be insertedly fastened thereinto is formed to penetrate in a thickness direction thereof; and
   a semiconductor chip mounted on one surface of the substrate,
   wherein the substrate includes:
      a metal board;
      an insulating layer formed on one surface of the metal board; and
      a circuit pattern formed on the insulating layer and including a chip mounting pad and an external connection pad, and
   wherein the fastening unit includes a non-conductive portion, the portion being in contact with the metal board and made of a non-conductive material.

2. The power module package as set forth in claim 1,
   wherein the fastening unit includes a portion made of a conductive material and a portion made of a non-conductive material, wherein the fastening unit is formed in the substrate such that the portion made of a conductive material is in contact with the external connection pad and the portion made of the non-conductive material is in contact with the metal board.

3. The power module package as set forth in claim 1,
   wherein the fastening unit is made of a non-conductive material and the power module package further includes a lead frame electrically connecting the external connection terminal to the external connection pad.

4. The power module package as set forth in claim 1,
   wherein the fastening unit includes:
      a female screw made of a non-conductive material; and
      a male screw made of a conductive material and having a recess formed in a length direction to allow the external connection terminal to be inserted thereinto, wherein the male screw is in contact with the external connection pad.

5. The power module package as set forth in claim 1,
   wherein the fastening unit includes:
      an upper portion protruded from one surface of the substrate;
      a central portion positioned within the substrate; and
      a lower portion buried inwardly from the other surface of the substrate in the thickness direction,
      wherein a diameter of the central portion is smaller than those of the upper and lower portions.

6. The power module package as set forth in claim 1, further comprising:
   a case formed on the substrate to cover one surface of the substrate and the semiconductor chip and expose the other end of the external connection terminal to the outside.

7. The power module package as set forth in claim 6, further comprising:
   a sealing member formed to cover one surface of the substrate and the semiconductor chip within the case.

8. The power module package as set forth in claim 1,
   wherein the semiconductor chip is a power element.

* * * * *